(12) United States Patent  
Jain et al.

(10) Patent No.: US 7,977,998 B2
(45) Date of Patent: Jul. 12, 2011

(54) APPARATUS AND METHOD FOR TESTING LEVEL SHIFTER VOLTAGE THRESHOLDS ON AN INTEGRATED CIRCUIT

(75) Inventors: Ashish R. Jain, Santa Clara, CA (US); Priya Ananthanarayanan, Cupertino, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 16 days.

(21) Appl. No.: 12/481,253

(22) Filed: Jun. 9, 2009

(65) Prior Publication Data

US 2010/0308887 A1    Dec. 9, 2010

(51) Int. Cl.
*H03L 5/00* (2006.01)
(52) U.S. Cl. ............... 327/333; 326/62; 326/81
(58) Field of Classification Search ......... 326/62–63, 326/80–81; 327/306, 333
See application file for complete search history.

(56) References Cited

U.S. PATENT DOCUMENTS

| 6,487,687 | B1 | 11/2002 | Blake et al. |
| 6,980,035 | B1 * | 12/2005 | Zhou et al. ............ 327/112 |
| 7,112,996 | B2 * | 9/2006 | Lee ............................ 326/68 |
| 7,248,243 | B2 * | 7/2007 | Murakami et al. ......... 345/98 |

* cited by examiner

*Primary Examiner* — Dinh T. Le
(74) *Attorney, Agent, or Firm* — Meyertons, Hood, Kivlin, Kowert & Goetzel, P.C.; Stephen J. Curran

(57) ABSTRACT

An apparatus and method for testing level shifter threshold voltages on an integrated circuit includes one or more level shifter modules each including a number of level shifter circuits. Each level shifter circuit may be coupled to a first and a second voltage supply. Each level shifter circuit may also receive an input signal that is referenced to the first voltage supply, and to generate an output signal that is referenced to the second voltage supply. In addition, each level shifter module may include detection logic that may detect an output value of each of the level shifter circuits. The control circuit may be configured to iteratively change the voltage output from one of the voltage supplies, and maintaining a voltage on the other voltage supply while the input signal is provided to the level shifter circuits. The detection logic may capture the output value upon each change in voltage.

20 Claims, 4 Drawing Sheets

APPARATUS AND METHOD FOR TESTING LEVEL SHIFTER VOLTAGE THRESHOLDS ON AN INTEGRATED CIRCUIT

BACKGROUND OF THE INVENTION

1. Field of the Invention

This invention relates to integrated circuits and, more particularly, to level shifter circuits.

2. Description of the Related Art

Circuits such as level shifter circuits may enable signals to pass between circuits operating in different voltage domains. For example, one circuit may operate at 0.4V while another circuit may operate at 1.3V. Level shifters may have an input that can recognize signal transitions referenced to the 0.4V supply, and may provide a corresponding output signal that is referenced to the 1.3V supply. Depending on process parameters during manufacturing, it may be possible for the voltage thresholds of the level shifter circuits to vary between manufacturing lots. This variability may present reliability problems.

The manufacturing of integrated circuits is a complex process. Bringing a new circuit design to a fabrication facility, or bringing an existing circuit design to a new fabrication facility may require a number of characterization steps to establish a device library. Depending on the process technology, and the complexity of the circuits, there may be several iterations of process adjustments to ensure reliable operation of the manufactured devices. In many cases, there may be several revisions of silicon before the design is fully operational. Accordingly, it may be desirable to provide a robust circuit design while reducing the number of iterations of process adjustments, particularly during device and process characterization.

SUMMARY

Various embodiments of an apparatus and method for testing level shifter threshold voltages on an integrated circuit are disclosed. In one embodiment, an integrated circuit may include one or more level shifter modules and a control circuit. Each of the level shifter modules may include a number of level shifter circuits that may be coupled to a first and a second voltage supply. In addition, each level shifter circuit may be configured to receive an input signal that is referenced to the first voltage supply and to generate an output signal that is referenced to the second voltage supply and which corresponds to the input signal. Further, each level shifter module may include detection logic that is coupled to each level shifter circuit and which may be configured to detect an output value of each of the level shifter circuits. The control circuit may be configured to iteratively change the voltage output from one of the voltage supplies while the input signal is provided to the level shifter circuits. For example, the voltage of one supply may be incrementally increased or decreased, and the voltage to the other supply may be held substantially constant. The detection logic may capture the output value upon each change in voltage.

In another embodiment, a method includes executing a level shifter test using a level shifter module having a number of level shifter circuits on an integrated circuit. Executing the level shifter test may include a first control circuit applying a first supply voltage and a second supply voltage to at least some of the level shifter circuits. The method may also include a second control circuit applying an input signal to the level shifter circuits. The method may further include the first control circuit iteratively changing the second supply voltage to the level shifter circuits while the input signal is provided to the level shifter circuits. The method also includes detection logic detecting an output value of the level shifter circuits upon each change in voltage.

Figure 1:
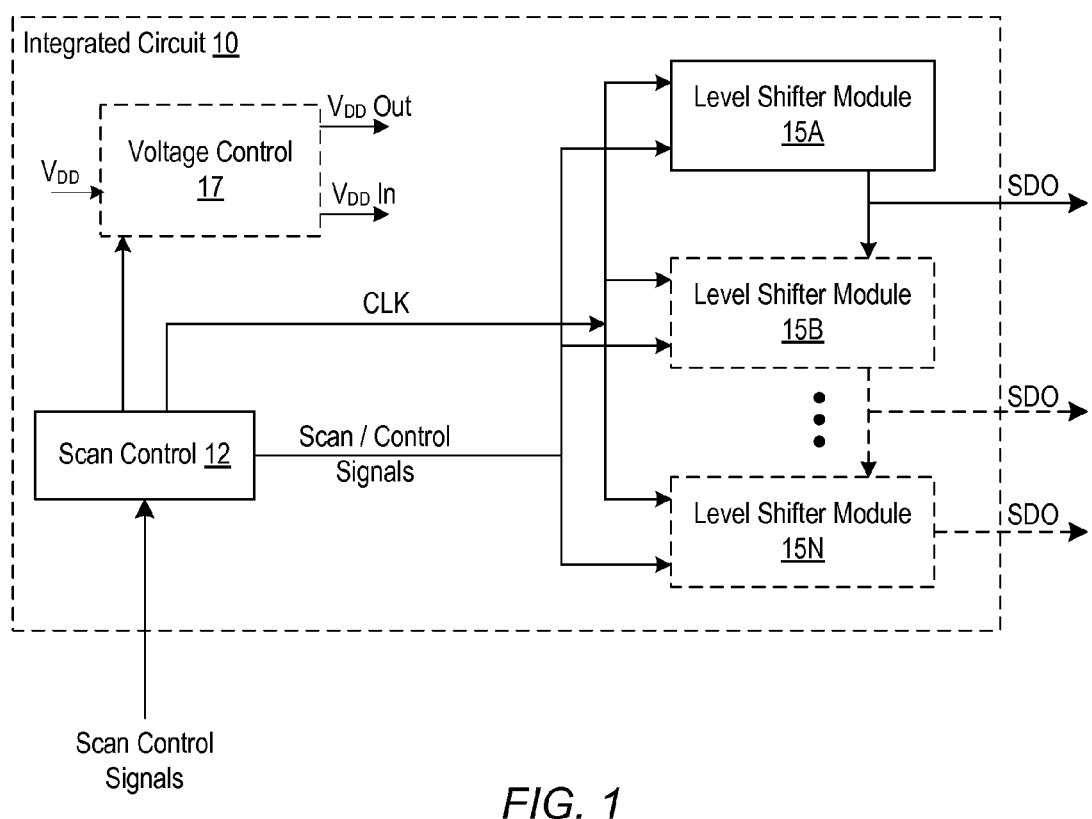
FIG. 1 is a block diagram of one embodiment of an integrated circuit including level shifter modules.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of an integrated circuit is shown. The integrated circuit 10 includes level shifter modules 15A, 15B and 15N. In addition, the integrated circuit 10 includes a scan control unit 12 that is coupled to provide scan control and other control signals and a clock (CLK) signal to level shifter module 15A through 15N. Further, in the illustrated embodiment, the integrated circuit 10 includes a voltage control unit 17 that is coupled to the scan control unit and to a voltage supply ($V_{DD}$). As denoted by the dashed lines, in various embodiments, there may be a single level shifter module or there may be multiple level shifter modules. Accordingly, in such multiple unit embodiments, N may be any whole number. It is noted that components having a reference designator including a number and a letter may be referred to by the number alone where appropriate.

The scan control unit 12 is coupled to receive various scan control signals from a source external to the integrated circuit (e.g. another component of the system that includes the integrated circuit 10, not shown in FIG. 1, or from a test system that may be connected directly or indirectly to the integrated circuit 10). As will be described in greater detail below, the level shifter modules 15 may be coupled serially into a scan chain (e.g. from level shifter module 15A to level shifter module 15B to level shifter module 15N to the scan data out (SDO) output of the integrated circuit 10, in the illustrated embodiment) to permit results to be scanned out of the level shifter modules 15A-15N for observation external to the integrated circuit 10. Alternatively, one or more of the level shifter modules 15 may be included in separate scan chains (e.g. with core logic circuitry, not shown in FIG. 1). There may also be a scan data input at the head of the scan chain, which may not be used by the level shifter modules 15 (the scan in data may be a don't care), but could be used by core circuitry included in the scan chain.

In one embodiment, level shifter modules 15 may include circuitry configured to determine voltage thresholds at which one or more level shifter circuits either operate reliably, or cease to operate reliably. More particularly, one or more level shifter modules 15 may be coupled to an input voltage supply (e.g., $V_{DD}$ In) and an output voltage supply (e.g., $V_{DD}$ Out). One of the voltage supplies may be held constant while the other voltage supply may be iteratively changed (e.g., increased or decreased) some number of times while an input signal is applied to a signal input of each level shifter. The output signal of each level shifter may be detected and captured to determine the operational voltage thresholds of the level shifters. This configuration is shown in FIG. 2 and described more fully below.

In one embodiment, voltage control unit 17 may be configured to increase and decrease the $V_{DD}$ In and $V_{DD}$ Out voltage supplies in response to control signals provided by the scan control unit 12, and/or from an external source such as a test system (not shown). In an alternative embodiment, instead of using a voltage control unit 17 as shown in FIG. 1, the external test system (not shown) may provide the $V_{DD}$ In and $V_{DD}$ Out supply voltages. In such embodiments, the test system may increase and decrease the supply voltages directly as desired.

Figure 2:
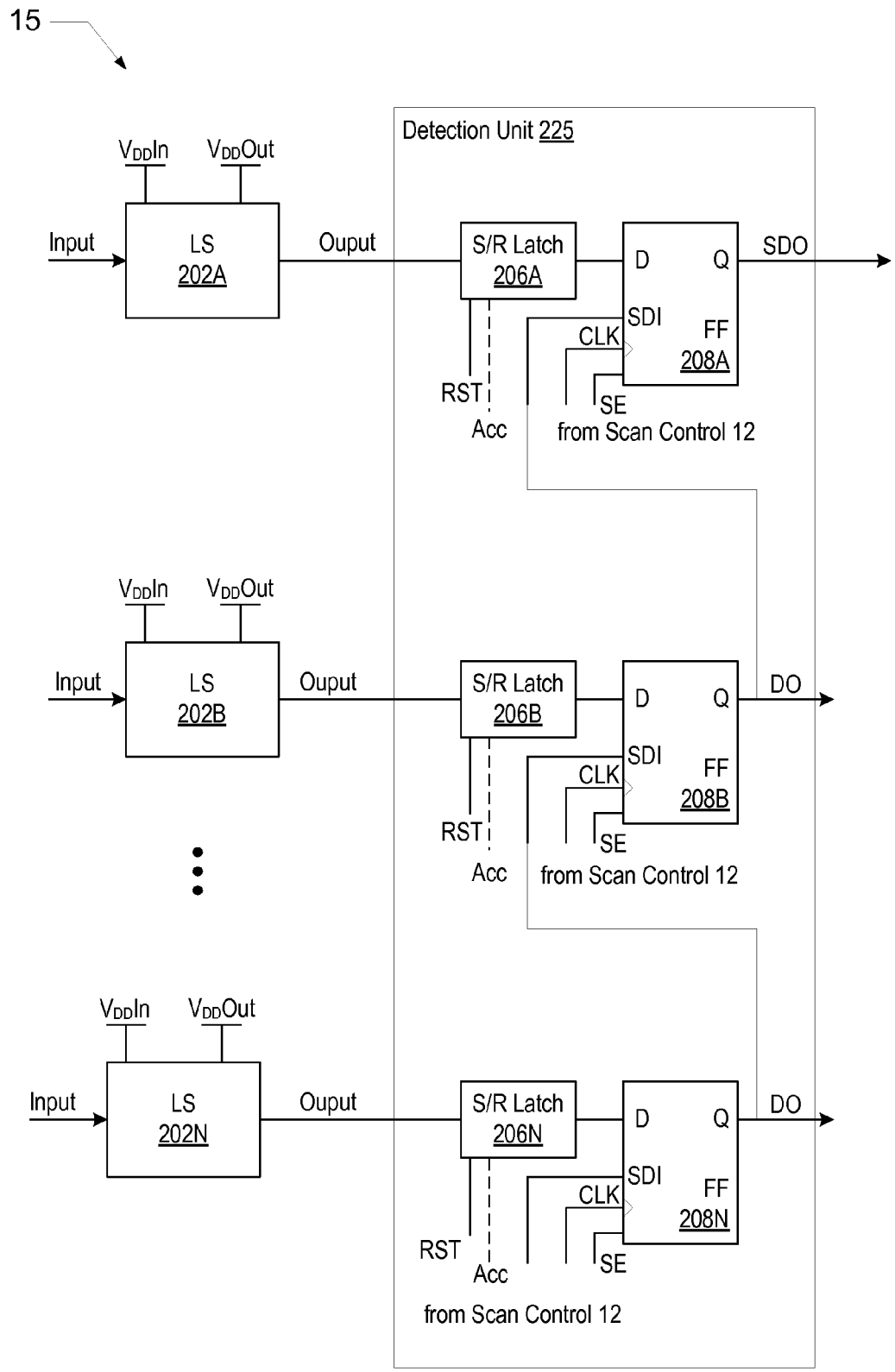
FIG. 2 is a diagram of one embodiment of a level shifter module shown in FIG. 1.

Referring to FIG. 2, a diagram of one embodiment of a level shifter module 15 is shown. The level shifter module 15 includes a number of level shifter circuits designated 202A through 202N, where N may be any whole number. Each level shifter circuit 202 is coupled to the two voltage supplies: $V_{DD}$ In and $V_{DD}$ Out. In addition, each level shifter 202 is coupled to receive an input signal, and to provide an output signal. As shown, each of the level shifter circuits 202 is coupled to a detection unit 225. In the illustrated embodiment, the detection unit 225 includes a number of set/reset (S/R) latches (e.g., 206A through 206N), and a number of flip-flops (e.g., 208A through 208N).

As shown, the output of each level shifter 202 is coupled to a respective S/R latch 206. The output of each S/R latch is coupled to a respective flip-flop 208. In the illustrated embodiment and as mentioned above, the flip-flops 208 are coupled together serially such that the output of one flip-flop (e.g., FF 208N) is coupled to the scan data in (SDI) input of a next flip-flop (e.g., FF 208B). The last flip-flop output is labeled scan data out (SDO). In addition, each flip-flop is coupled to receive scan control signals (e.g., CLK, and scan enable (SE)) from scan control unit 12 of FIG. 1. Similarly, each S/R latch 206 is coupled to receive control signals such as a reset (RST) signal and, in some embodiments, an accumulate (ACC) signal, for example.

During operation, the supply voltages, $V_{DD}$ In and $V_{DD}$ Out, may applied to each level shifter circuit 202 while an input signal may be applied to the input of each level shifter circuit 202. The output of the level shifters 202 are latched, and may be output for observation. For example, a voltage corresponding to logic level of one may be applied to the input. Each S/R latch 206 may be reset with the RST signal to clear the latch. At predetermined intervals, one of the supply voltages (e.g., $V_{DD}$ Out) may be either increased or decreased while the other supply voltage (e.g., $V_{DD}$ In) is held substantially constant, and the output values of the level shifter circuits 202 may be latched. During the time that the changing supply voltage is at a given voltage, control signals may be applied to the detection unit 225. For example, in one mode, the CLK signal may transition to clock FF 208A-208N to capture the output of the S/R latches 206A-206N. The S/R latches may be reset with the RST signal, and the scan enable signal (SE) may be asserted so that the captured values may be scanned out of the flip-flops 208 and analyzed or stored for future analysis. This or a similar sequence may be repeated for each change in voltage level.

By analyzing the level shifter output values across some range of supply voltages, the threshold voltage at which the level shifters output a logic value of one may be determined. Similarly, a logic level of zero may be applied to the input of the level shifters 202 to ensure that the level shifters 202 can correctly output a logic value of zero across some range of supply voltages. Further, in other test sequences, the $V_{DD}$ In voltage supply may be changed while the $V_{DD}$ Out voltage supply may be held substantially constant.

In another embodiment, the S/R latches 206 may operate in an "accumulate" node in which the ACC signal may be applied to the S/R latches 206. In the accumulate mode, each S/R latch 206 may be configured to receive feedback from the FF 208 to which it is connected. Each FF 208 may then be clocked some predetermined number of times, and the S/R latch retains the output value from the respective FF 208 until the output of the level shifter 202 changes. In such an embodiment, each S/R latch 206 may include additional circuitry such as combinatorial and multiplexing logic (not shown), for example. After the predetermined number of clocks, the captured values may be scanned out and analyzed or stored for future analysis.

Depending on the captured value of each of FF 208, the threshold voltage of each of the level shifter circuits 202 may be determined. For example, when the input value is a logic level of one, if the captured level shifter output value is a logic value of one, then the level shifter 202 was able to correctly output a logic value of one across the range of supply voltages. Conversely, if the captured level shifter output becomes a zero, the supply voltage at which the output transitioned to a zero may be determined. In a similar way, the operation may be tested for an input logic level of zero.

In one implementation, there may be 12 level shifter circuits 202 in a given level shifter module 15. In addition, there may be any number of such level shifter modules 15 on integrated circuit 10. Further, in one implementation, there may be a number of different types of level shifter circuits 202, and each type may use a different circuital implementation. As such, to ensure correct operation of all types of level shifters, there may be multiple instantiations of one or more types of level shifter circuit 202 on the integrated circuit 10.

Figure 3:
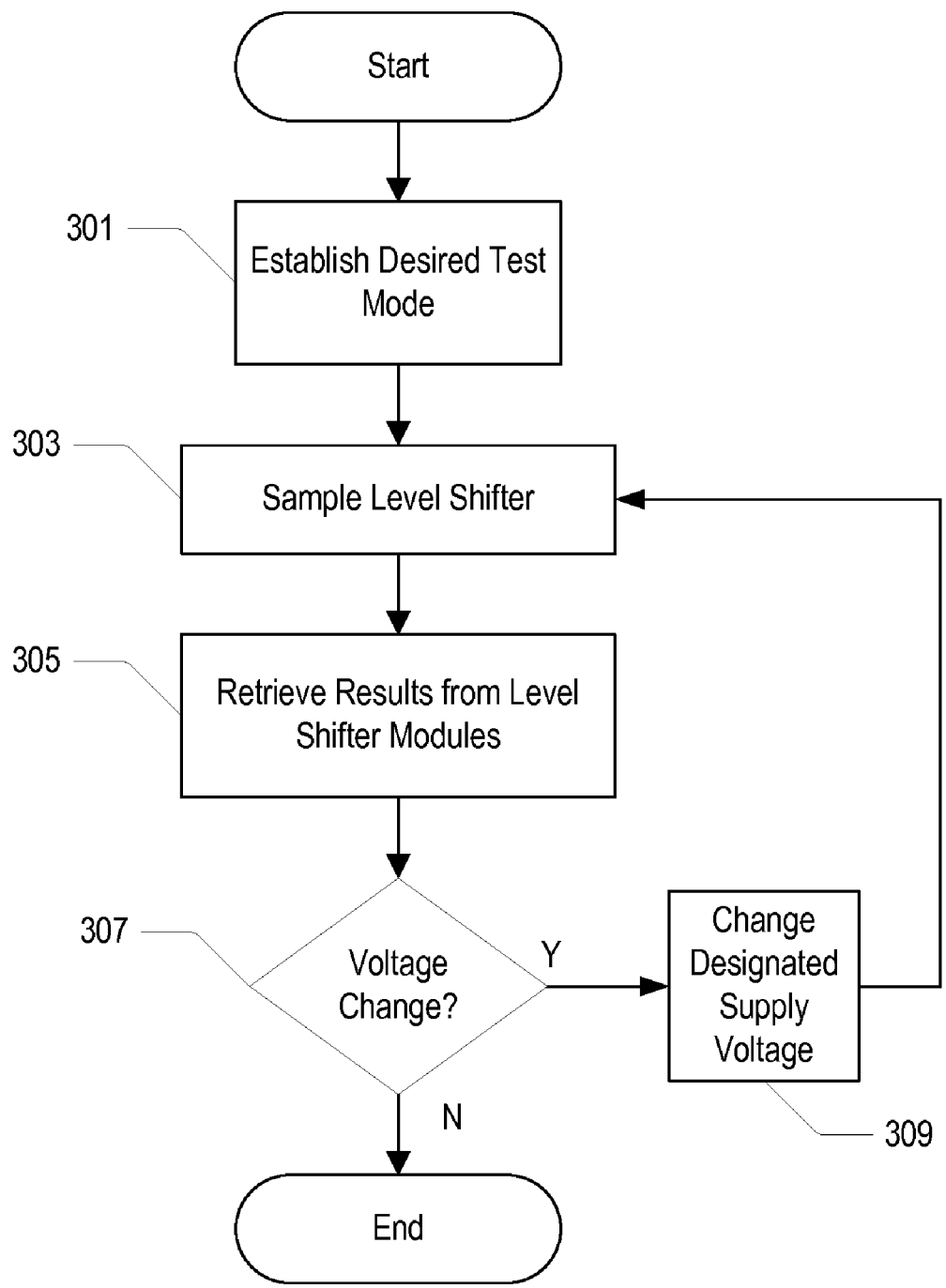
FIG. 3 is a flow diagram describing operational aspects of the embodiments of the level shifter module depicted in FIG. 1 and FIG. 2.

In FIG. 3, a flow diagram that depicts the operation of one embodiment of integrated circuit 10 is shown. While the blocks are shown in a particular order for ease of understanding, other orders may be used. Referring collectively to FIG. 1 through FIG. 3 and beginning in block 301 of FIG. 3, the desired test mode may be established in some embodiments. For example, in one embodiment, the supply voltages and the input signal may be applied to each level shifter circuit. In other embodiments, a specific test mode may be invoked. After a predetermined amount of time has elapsed, the flip-flops 208 of FIG. 2 may be clocked one or more times to capture or sample the output level corresponding to the level shifter output (block 303). In one embodiment, the scan control unit 12 may clock the flip-flops. Alternatively, other clock circuitry (not shown) may clock the flip-flops.

In one embodiment, once the flip-flops have captured the output levels, the results may be retrieved (block 305). For example, in one embodiment, the scan control unit 12 may gate the CLK signal, assert the SE signal to the flip-flops and then provide a number of CLK pulses sufficient to clock the flip-flop values serially through one or more scan chains that include the flip-flops, and out the SDO pin of the IC 10 as described above. Based upon the digital values scanned out, a determination may be made as to what, if any, the threshold voltage may be for a given level shifter circuit 202.

In various embodiments, the scan data may be output to a device tester, or other system or device used for testing integrated circuits. Alternatively, the results may stored into a memory (not shown) located on or off the integrated circuit 10 for future retrieval and analysis.

Once the captured values have been retrieved, if there are more supply voltage levels to check (block 307), a designated one of the supply voltages is changed (e.g., increased or decreased) by a predetermined amount (block 309). Operation proceeds as described above in block 303 in which the flip-flops 208 of FIG. 2 may be clocked one or more times to capture or sample the output level corresponding to the level shifter output. Referring back to block 307, if all supply voltage levels have been checked, the level shifter test is complete.

As mentioned above, in one embodiment, the above testing procedure may be implemented using a test system (not shown) suitably connected to integrated circuit 10. The test system may include some type of processing unit that may execute test software which may cause various events to occur. For example, in various embodiments, in response to execution of the test instructions, the test system may provide signals corresponding to the scan control signals, one or more clock signals, one or more supply voltages, and the like. However, it is likewise contemplated that in other embodiments, all or a portion of the level shifter testing functionality may be implemented using components embedded on integrated circuit 10, and thus a minimum of control signals may be provided by the test system.

It is noted that although the above embodiments are shown using scannable flip-flops 208, it is contemplated that in other embodiments the scannable flip-flops 208 may be removed, and scannable S/R latches may be used, thereby eliminating the flip-flops 208. A scannable element refers to a sequential logic element such as a flip-flop, for example, that may capture a data value in response to a clock or other signal during a normal operation, and then capture a scan data value in response to a scan enable signal. It is also contemplated that in another embodiment, the latched values from the S/R latches 206 may be stored directly within a memory array (not shown) on the integrated circuit 10, and upon completion of the testing, the memory array data may be output for analysis.

It is further noted that in one embodiment, integrated circuit 10 may be implemented as a test chip on a wafer, in which case the integrated circuit 10 may not have other functionality. In other embodiments, level shifter modules 15 may be implemented within the scribe lines of a wafer. In still other embodiments, integrated circuit 10 may include other functionality. For example, integrated circuit 10 may be a processor chip, a communication chip, a controller, or the like. In such embodiments, the level shifter modules 15 may be implemented as just one part of the integrated circuit 10 chip. One such embodiment is shown in FIG. 4.

Figure 4:
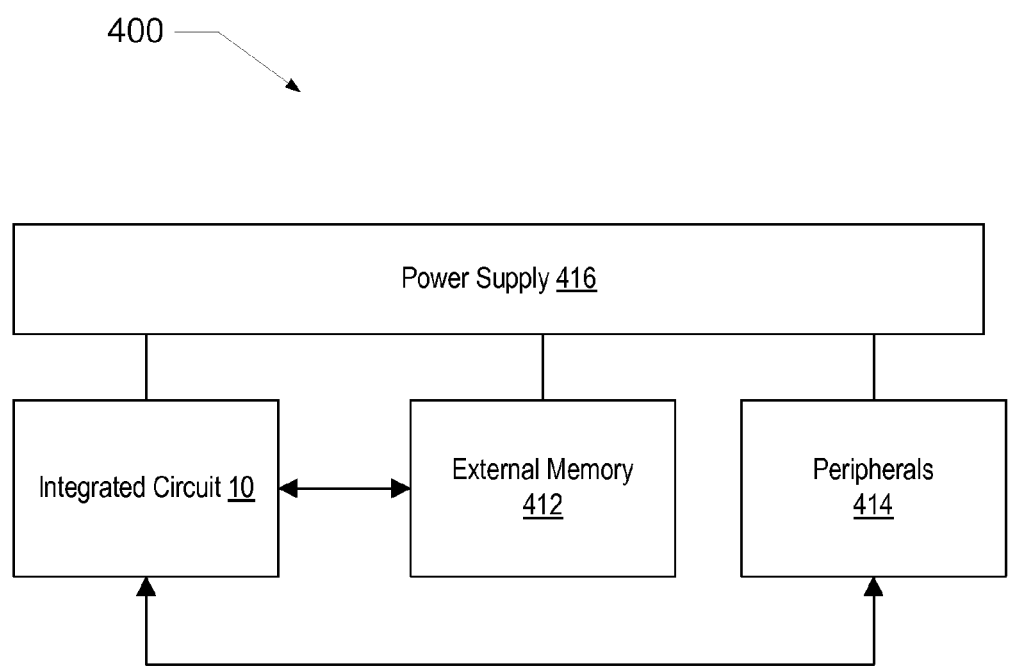
FIG. 4 is a block diagram of one embodiment of a system including the integrated circuit shown in FIG. 1

Turning to FIG. 4, a block diagram of one embodiment of a system 400 including the integrated circuit 10 is shown. The system 400 includes at least one instance of the integrated circuit 10 of FIG. 1 coupled to one or more peripherals 414 and an external memory 412. The system 400 also includes a power supply 416 that may provide one or more supply voltages to the integrated circuit 10 as well as one or more supply voltages to the memory 412 and/or the peripherals 414. In some embodiments, more than one instance of the integrated circuit 10 may be included.

The external memory 412 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 414 may include any desired circuitry, depending on the type of system 110. For example, in one embodiment, the system 400 may be a mobile device and the peripherals 414 may include devices for various types of wireless communication, such as WiFi, Bluetooth, cellular, global position system, etc. The peripherals 414 may also include additional storage, including RAM storage, solid-state storage, or disk storage. The peripherals 414 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
  one or more level shifter modules, each including:
    one or more level shifter circuits, each coupled to receive a first supply voltage and a second supply voltage, and wherein each level shifter circuit is configured to receive an input signal that is referenced to the first supply voltage and to generate an output signal that is referenced to the second supply voltage and wherein the output signal corresponds to the input signal; and
    detection logic coupled to each of the level shifter circuits and configured to detect an output value of each of the one or more level shifter circuits; and
  a control circuit coupled to the one or more level shifter modules and to a reference voltage supply source, and configured to iteratively change one of the first supply voltage and the second supply voltage responsive to a control signal while the input signal is provided to the one or more level shifter circuits;
  wherein the detection logic is further configured to capture the output value upon each change in the first supply voltage and each change in the second supply voltage.

2. The integrated circuit as recited in claim 1, wherein the control circuit is further configured to keep the remaining one of the first and the second supply voltage at a substantially constant output voltage level.

3. The integrated circuit as recited in claim 1, wherein the detection logic comprises one or more latch circuits, each configured to latch and output the output value of a corresponding one of the one or more level shifter circuits.

4. The integrated circuit as recited in claim 3, wherein the detection logic comprises one or more flip-flop circuits, each coupled to a corresponding one of the latch circuits, wherein each flip-flop circuit is configured to capture and output a digital value that corresponds to the output value.

5. The integrated circuit as recited in claim 4, wherein the one or more flip-flop circuits are coupled together in a scan chain such that an output of a first flip-flop is coupled to a scan data input of a next flip-flop and an output of the last flip-flop in the scan chain is coupled to a scan data output of the integrated circuit, and wherein in response to an assertion of a scan enable signal and a number of clock signal pulses received by the one or more flip-flop circuits, the captured digital values may be sequentially shifted out to the scan data output.

6. An integrated circuit comprising:
one or more level shifter circuits, each coupled to receive a first supply voltage and a second supply voltage, and wherein each level shifter circuit is configured to receive an input signal that is referenced to the first supply voltage and to generate an output signal that is referenced to the second supply voltage and wherein the output signal corresponds to the input signal;
a control circuit coupled to the one or more level shifter modules and to a reference voltage supply source, and configured to iteratively change one of the first supply voltage and the second supply voltage responsive to a control signal while the input signal is provided to the one or more level shifter circuits;
detection logic coupled to each of the level shifter circuits and configured to detect an output value of each of the one or more level shifter circuits upon each change in the first supply voltage and each change in the second supply voltage.

7. The integrated circuit as recited in claim 6, wherein the output value of each of the at least some of the level shifter circuits indicates whether a given level shifter circuit was able to switch at a particular applied voltage.

8. The integrated circuit as recited in claim 6, wherein a transition in the output value of a given level shifter circuit corresponds to an operational threshold voltage level for the given level shifter circuit.

9. The integrated circuit as recited in claim 6, wherein the control circuit is further configured to keep the output voltage of the remaining one of the first supply voltage and the second supply voltage at a substantially constant voltage level.

10. The integrated circuit as recited in claim 6, wherein the detection logic comprises one or more latch circuits, each configured to latch and output the output value of a corresponding one of the one or more level shifter circuits.

11. The integrated circuit as recited in claim 10, wherein the detection logic further comprises one or more flip-flop circuits, each configured to capture and output a digital value that corresponds to the output value of a corresponding one of the latch circuits in response to a transition of clock signal.

12. A level shifter module comprising:
one or more level shifter circuits, each coupled to receive a first supply voltage and a second supply voltage, and wherein each level shifter circuit is configured to receive an input signal that is referenced to the first supply voltage and to generate an output signal that is referenced to the second supply voltage and wherein the output signal corresponds to the input signal;
detection logic coupled to each of the level shifter circuits and configured to detect an output value corresponding to the output signal of each of the one or more level shifter circuits each time the second supply voltage is changed; and
a control circuit coupled to the one or more level shifter circuits and to a reference voltage supply source and configured to iteratively change the second supply voltage responsive to a control signal while the input is provided to the one or more level shifter circuits.

13. The level shifter module as recited in claim 12, wherein the detection logic further comprises one or more latch circuits, each configured to latch and output the output value of a corresponding one of the one or more level shifter circuits.

14. The level shifter module as recited in claim 13, wherein the detection logic further comprises one or more flip-flops, each configured to capture and output a digital value that corresponds to the output value of a corresponding one of the latch circuits in response to a transition of clock signal that is provided following each change in a voltage level of the second voltage supply.

15. A method comprising:
executing a level shifter test using a level shifter module including a plurality of level shifter circuits within an integrated circuit, wherein executing the level shifter test comprises the steps of:
providing a first control circuit to generate applying a first supply voltage to at least some of the plurality of level shifter circuits and a second supply voltage to the at least some of the plurality of level shifter circuits in response to a control signal and a reference supply voltage;
providing a second control circuit to generate an input signal to the at least some of the plurality of level shifter circuits;
the first control circuit iteratively changing the second supply voltage to the at least some of the plurality of level shifter circuits while the input signal is provided to the at least some of the plurality of level shifter circuits;
providing a detection logic to detect an output value of the at least some of the plurality of level shifter circuits upon each change in the second supply voltage.

16. The method as recited in claim 15, further comprising the first control circuit keeping the first supply voltage to the at least some of the plurality of level shifter circuits at a substantially constant output voltage level, while the input signal is provided to the at least some of the plurality of level shifter circuits.

17. The method as recited in claim 15, wherein iteratively changing the second supply voltage includes incrementally increasing the second supply voltage a predetermined amount.

18. The method as recited in claim 15, wherein iteratively changing the second supply voltage includes incrementally decreasing the second supply voltage a predetermined amount.

19. The method as recited in claim 15, further comprising for each of the at least some level shifter circuits, the detection logic capturing the output value and outputting a corresponding digital value in response to a transition of clock signal.

20. The method as recited in claim 15, further comprising the second control circuit generating control signals to serially shift each digital value out of the integrated circuit in a scan chain.

* * * * *